US012603249B2

(12) United States Patent
Chen et al.

(10) Patent No.:     US 12,603,249 B2
(45) Date of Patent:     Apr. 14, 2026

(54) SELECTIVE DEPOSITION USING DIFFERENTIAL SURFACE CHARGING

(71) Applicant: Tokyo Electron Limited, Tokyo (JP)

(72) Inventors: Ya-Ming Chen, Austin, TX (US);
Shyam Sridhar, Austin, TX (US);
Peter Lowell George Ventzek, Austin,
TX (US)

(73) Assignee: Tokyo Electron Limited, Tokyo (JP)

( * ) Notice: Subject to any disclaimer, the term of this
patent is extended or adjusted under 35
U.S.C. 154(b) by 13 days.

(21) Appl. No.: 18/439,493

(22) Filed: Feb. 12, 2024

(65) Prior Publication Data

US 2025/0259824 A1     Aug. 14, 2025

(51) Int. Cl.
*H01J 37/32*     (2006.01)
*C23C 16/04*     (2006.01)

(52) U.S. Cl.
CPC ...... *H01J 37/32357* (2013.01); *C23C 16/042*
(2013.01); *C23C 16/047* (2013.01); *H01J
37/32422* (2013.01); *H01J 37/32669*
(2013.01); *H01J 37/32697* (2013.01); *H01J
2237/3321* (2013.01); *H01J 2237/3341*
(2013.01)

(58) Field of Classification Search
CPC ....... H01J 2237/3321; H01J 2237/3341; H01J
37/32357; H01J 37/32422; H01J
37/32669; H01J 37/32697; C23C 16/042;
C23C 16/047
USPC ...................................................... 118/723 R
See application file for complete search history.

(56) References Cited

U.S. PATENT DOCUMENTS

| | | | | |
|---|---|---|---|---|
| 10,141,161 | B2 * | 11/2018 | Gilchrist ........... | H01J 37/32422 |
| 2016/0276134 | A1 * | 9/2016 | Collins ............. | H01L 21/67213 |
| 2017/0092470 | A1 * | 3/2017 | Ramaswamy .... | H01J 37/32422 |
| 2019/0122860 | A1 * | 4/2019 | Lee ..................... | H01L 21/6831 |
| 2021/0066047 | A1 * | 3/2021 | Sung ................. | H01L 21/31116 |

OTHER PUBLICATIONS

Jiwon Jung, et al., "Low-energy electron beam generation in inductively coupled plasma via a DC biased grid", Plasma Sources Science and Technology, vol. 31, Feb. 4, 2022, 10 pages, IOP Publishing Ltd.
S.F. Yoon, et al., "DC bias effects in the deposition of a-C:H films using the screen-grid method in electron cyclotron resonance chemical vapour deposition", Diamond and Related Materials, vol. 7, Mar. 27, 1998, 6 pages, Elsevier Science S.A.

* cited by examiner

*Primary Examiner* — Charlee J. C. Bennett
(74) *Attorney, Agent, or Firm* — Slater Matsil, LLP

(57)     ABSTRACT
A method includes extracting electrons from a remote electron source to negatively charge upper surfaces of a patterned layer with the electrons, and extracting positive ions from a remote ion source to selectively deposit a material on the upper surfaces by attracting the positive ions to the electrons of the upper surfaces. The upper surfaces may be negatively charged by concurrently applying a positive bias at the patterned layer and applying source power with a lower power level to generate plasma. The material may be selectively deposited by concurrently applying a negative bias at the patterned layer and applying source power with a higher power level to plasma. An extraction grid may separate the patterned layer from the plasma. The extraction grid may be electrically floating or coupled to a ground potential during either of the electron extraction step or the ion extraction step.

20 Claims, 9 Drawing Sheets

901 extract electrons from a remote electron source to negatively charge upper surfaces of a patterned layer with electrons

902 extract positive ions from a remote ion source to selectively deposit a material on the upper surfaces by attracting the positive ions to the electrons of the upper surfaces

Figure 10:
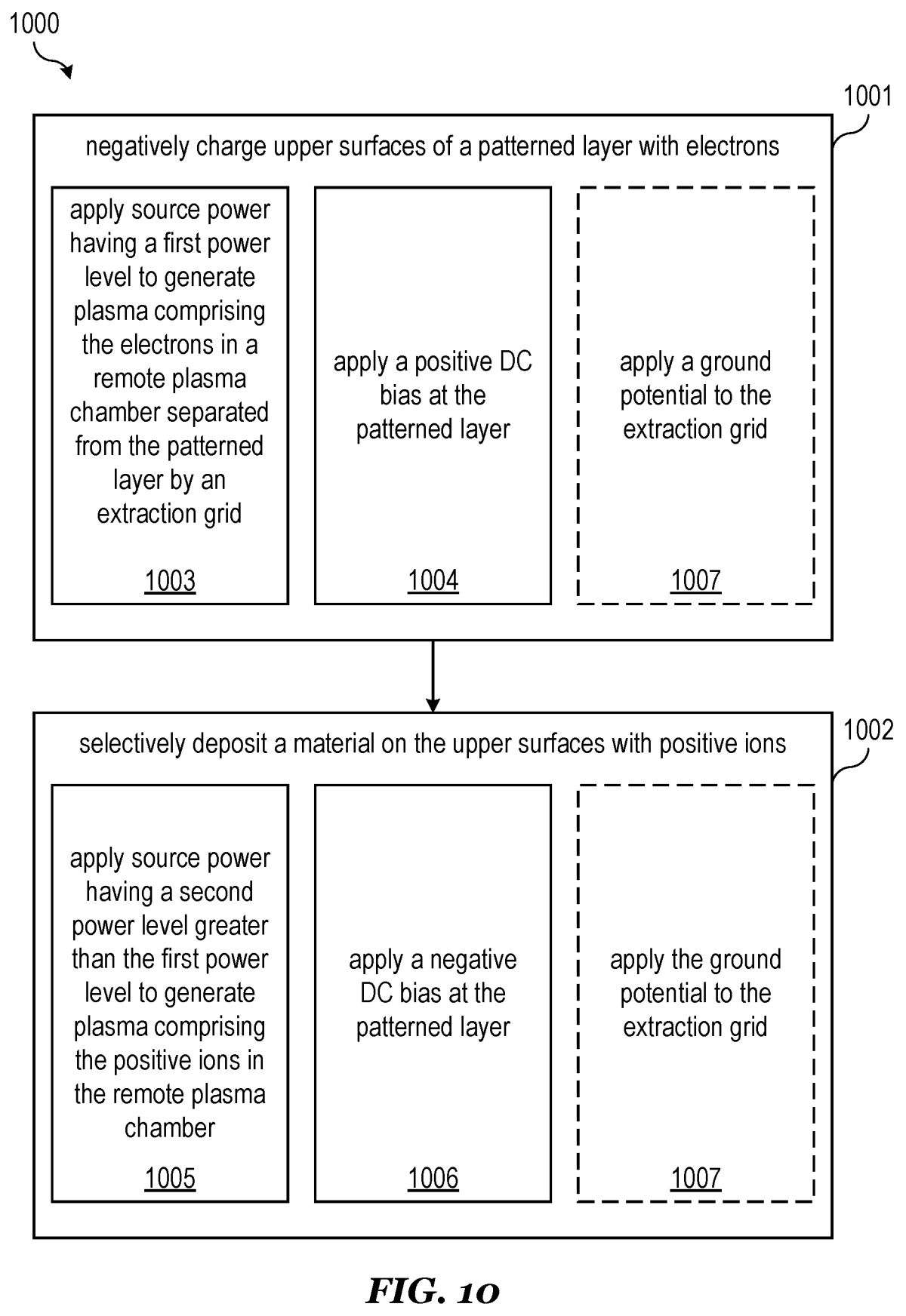

1000

1001 negatively charge upper surfaces of a patterned layer with electrons apply source power having a first power level to generate plasma comprising the electrons in a remote plasma chamber separated from the patterned layer by an extraction grid

1003 apply a positive DC bias at the patterned layer

1004 apply a ground potential to the extraction grid

1007

1002 selectively deposit a material on the upper surfaces with positive ions apply source power having a second power level greater than the first power level to generate plasma comprising the positive ions in the remote plasma chamber

1005 apply a negative DC bias at the patterned layer

1006 apply the ground potential to the extraction grid

SELECTIVE DEPOSITION USING DIFFERENTIAL SURFACE CHARGING

TECHNICAL FIELD

The present invention relates generally to selective deposition processes, and, in particular embodiments, to systems and methods for selectively depositing material using differential surface charging.

BACKGROUND

Microelectronic device fabrication typically involves a series of manufacturing techniques that include formation, patterning, and removal of a number of layers of material on a substrate. Etch masks may be formed (e.g., deposited, grown, patterned) to protect regions of the substrate and allow for pattern transfer via etching. Wet or dry etching processes may be used, with plasma etching processes being an example of a dry etching process. Etching processes are used extensively to form networks of electronic components and interconnect elements (e.g., transistors, resistors, capacitors, metal lines, contacts, and vias) that are integrated in a monolithic structure (i.e., an integrated circuit).

Photolithographic processes are often utilized to form etch masks by exposing a photoresist layer to structured actinic radiation and developing the photoresist to form a relief pattern. The relief pattern can then be transferred to an underlying layer of the photoresist layer (e.g., an etch target layer or an underlying hard mask layer formed over an etch target layer). The minimum feature size of photolithographic techniques is limited by the resolution of the optical system (e.g., because of diffraction limitations that depend on the wavelength of the actinic radiation used for the exposure).

As technology advances, feature sizes (i.e., critical dimensions) are reduced and device density increases. Since shorter wavelengths are less hindered by diffraction limitations, extreme ultraviolet (EUV) lithography has become widely used, for sub-10 nm technology nodes (e.g., 13.5 nm EUV lithography for 7 nm and 5 nm technology nodes). However, with the improved optical resolution, EUV photoresists present significant engineering challenges for meeting stringent cost and/or quality requirements. For instance, smaller dimensionality decreases feature stability and exacerbates interactions between the features of the mask, which can lead to photoresist line or pillar collapse. To account for this and other issues such as the depth of focus of the optics, low aspect ratio photoresist patterns (e.g., having a film thickness <15 nm) may be used. However, during the subsequent etch process, thinner photoresist films may be excessively damaged or etched away entirely destroying the integrity of the pattern transfer (i.e., there is a low resist budget). Moreover, stochastically-driven irregularities (such as line roughness, resist height thinning, line thinning, line edge roughness (LER), line width roughness (LWR), resist wiggling, etc.) are amplified by the reduced size and increased density of the features.

Selective deposition processes (also referred to as area selective deposition (ASD) processes) can be used to selectively deposit (i.e., grow) a material on desired surfaces (e.g., a patterned mask surface) while depositing less of the material (or even none of the material) on other surfaces (e.g., exposed underlying materials). Selective deposition can be difficult, such as when the material being deposited interacts similarly with both the desired surfaces and the undesired surfaces. Even worse, some systems exhibit reverse selectivity to certain materials (e.g., the material selectively deposits on the undesired surfaces relative to the desired surfaces).

Selective deposition processes have been used to mitigate problems associated with reduced mask material (such as those mentioned above). Unfortunately, the typical methods and chemistries to date depend on lengthy multistep processes that depend on the material composition and surface structure of the photoresist. For example, conventional selective deposition processes may form a passivating layer on a target area while avoiding deposition on an area with a different composition, structure and topography. Another conventional method uses cyclic deposition-etch cycles which are time-consuming and require etching, which imposes additional limitations. Therefore, improved selective deposition methods that efficiently and selectively deposit material without etching and independent of material composition and surface structure may be desirable.

SUMMARY

In accordance with an embodiment of the invention, a method includes extracting electrons from a remote electron source to negatively charge upper surfaces of a patterned layer with the electrons, and extracting positive ions from a remote ion source to selectively deposit a material on the upper surfaces by attracting the positive ions to the electrons of the upper surfaces.

In accordance with another embodiment of the invention, a method includes negatively charging upper surfaces of a patterned layer with electrons by concurrently applying source power having a first power level to generate plasma including the electrons in a remote plasma chamber separated from the patterned layer by an extraction grid and applying a positive direct current (DC) bias at the patterned layer. The method further includes selectively depositing a material on the upper surfaces with positive ions by concurrently applying source power having a second power level greater than the first power level to generate plasma including the positive ions in the remote plasma chamber and applying a negative DC bias at the patterned layer.

In accordance with still another embodiment of the invention, a plasma system includes a processing chamber, a remote plasma chamber configured to contain plasma including electrons and positive ions, an extraction grid separating the processing chamber and the remote plasma chamber, a substrate support disposed in the processing chamber and configured to support a substrate including a patterned layer fluidically coupled to the remote plasma chamber through the extraction grid, an electron source gas fluidically coupled to the remote plasma chamber through one or more valves, an ion source gas fluidically coupled to the remote plasma chamber through the one or more valves, a source power supply configured to generate the plasma in the remote plasma chamber, a DC bias power supply electrically coupled to the substrate support, and a controller operatively coupled to the one or more valves, the DC bias power supply, and the source power supply. The controller includes a processor and a non-transitory computer-readable medium storing a program including instructions that, when executed by the processor, performs a method including negatively charging upper surfaces of a patterned layer with the electrons by concurrently applying source power from the source power supply to generate plasma including the electrons in a remote plasma chamber separated from the patterned layer and applying a positive DC bias from the DC bias power supply to the substrate holder. The method further includes selectively depositing a material on the upper surfaces with positive ions by concurrently applying source power from the source power supply to generate plasma including the positive ions in the remote plasma chamber and applying a negative DC bias from the DC bias power supply to the substrate holder.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates an example selective deposition process that includes a surface charging step and a selective deposition step, where the remote electron source and the remote ion source are different remote plasmas in accordance with embodiments of the invention;

FIG. 10 illustrates another example method of selectively depositing a material on upper surfaces of a patterned layer in accordance with embodiments of the invention.

Figure 1:
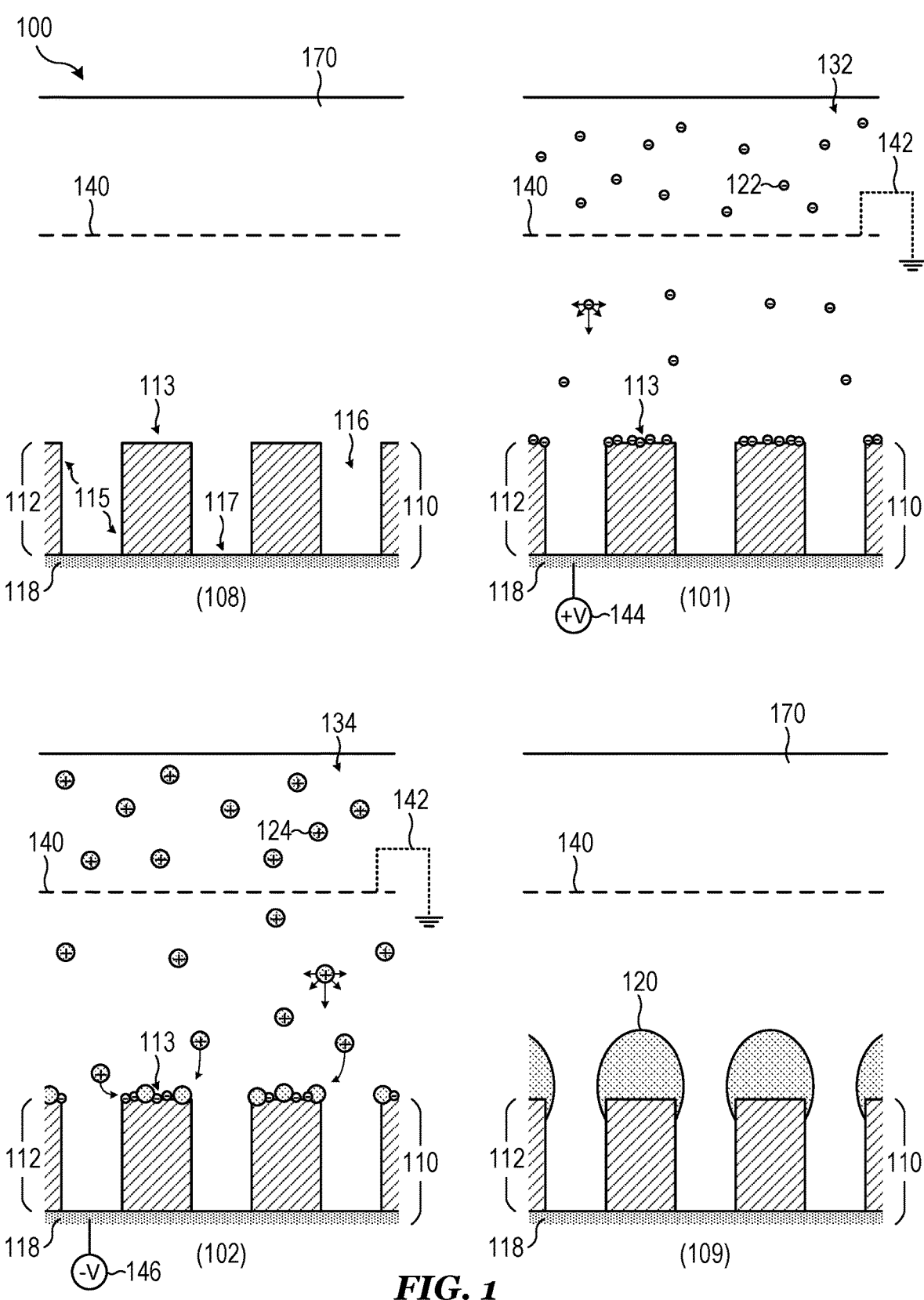
FIG. 1 illustrates an example selective deposition process that includes a surface charging step to negatively charge upper surfaces of a patterned layer and a deposition step to selectively deposit a material on the upper surfaces in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

With high-NA (numerical aperture) EUV lithography on the horizon, resist thickness continues to shrink and problems with stochastically driven roughness become more detrimental. These problems are transferred to underlying layers during the etching process, leading to problems with etch profile and uniformity, ultimately reducing yield, or in some cases rendering the processes completely intractable. Shrinking resist thickness (i.e., lower resist budget) may also cause issues that require higher selectivity during etches.

At the processing stage that these problems manifest, the mask has already been formed so that an underlayer is exposed through openings in the mask. For this reason, selective deposition is potentially attractive for mitigating these issues without adversely affecting the process of transferring the pattern to the underlayer. For example, materials selectively deposited on the mask surfaces may "heal" defects (e.g., smooth, fix breaks) in the mask pattern while depositing little or no material on the underlayer.

Additionally, selective deposition methods may be used to improve the resist budget during an etching process. The resist budget can be thought of as the effective selectivity of the mask layer relative to an underlying layer (i.e., the target layer being etched). For example, as a pattern is being transferred from a mask layer to an underlying layer, the mask layer is being etched (e.g., at a slower rate) than the underlying layer. Selectively increasing the height of the pattern features during the etching process can increase the amount of time it takes to etch away the features and thereby increase the effective selectivity (resist budget) of the mask layer relative to the underlying layer.

However, conventional direct selective deposition on many materials is only possible for a narrow selection of deposition materials. Further, conventional indirect selective deposition methods require the formation of an intermediate layer that is then reacted with a different compound to from the deposited material in a subsequent step. Consequently, such conventional methods are highly chemistry-dependent and still often have the drawback of requiring chemical compatibility of the intermediate layer with the patterned layer.

In accordance with embodiments herein described, the invention proposes a selective deposition process that selectively deposits a material (e.g., polymer) on upper surfaces of a patterned layer by charging the upper surfaces relative to other surfaces. The embodiment selective deposition processes described herein may advantageously selectively deposit any desired material on the patterned layer as long as the material can be deposited using positive ions. Additionally, the upper surfaces are charged using electrons, which has the benefit of facilitating direct selective deposition of the material (as opposed to conventional methods that use multiple compounds to form the deposited material).

Specifically, the selective deposition process includes two steps: a surface charging step and a selective deposition step. During the surface charging step, a remote electron source is used to provide electrons (e.g., low-energy substantially directionless electrons) at upper surfaces of a patterned layer. For example, the electrons may be extracted from the remote electron source to negatively charge the upper surfaces with the electrons. Positive ions (e.g., polymerizing ions such as carbon-containing ions like fluorocarbons, hydrofluorocarbons, etc.) are then extracted from a remote ion source (e.g., low-energy substantially directionless ions) to selectively deposit a material on the upper surfaces by attracting the positive ions to the electrons collected on the upper surfaces.

The remote electron source may be a remote plasma source. Electrons may be generated in a remote plasma chamber that is separated from the patterned layer by an extraction grid. Source power at a low power level may applied to generate plasma in the remote plasma chamber (e.g., source power that is high enough to generate a plasma, but low enough to maintain a continuous plasma sheath at the extraction grid). A positive direct current (DC) bias may also be applied at the patterned layer to attract electrons that pass through the plasma sheath to the upper surfaces. The positive DC bias has a low enough voltage to maintain the substantially directionless quality of the electrons while still collecting the electrons at the upper surfaces.

Similarly, the remote ion source may also be a remote plasma source (either using the same plasma or different plasmas). Source power at a higher power level may be applied to generate plasma in the remote plasma chamber (e.g., source power that is high enough to promote plasma molding around the extraction grid and allow positive ions to pass through the extraction grid). A negative DC bias may also be applied at the patterned layer to form a potential gradient accelerating positive ions towards the patterned layer. However, similar to the negative DC bias, the positive DC bias also has a low enough voltage to avoid imparting significant directionality to the positive ions (i.e., so that the negatively charged upper surfaces exert a meaningful attractive force on the positive ions). The positive ions collect at the upper surfaces and the material is selectively deposited.

The embodiment selective deposition processes described herein may afford various potential benefits, such as increasing resist budget, which may be particularly important when resist height is small, such as in EUV processes where the resist height may be on the order of 20 nm. Selective deposition on a wide variety of resists (including metal-containing resists) may advantageously help with mask budget in addition to possibly addressing roughness concerns during pattern transfer. The selective deposition may also facilitate improved process transfer for smaller features by smoothing mask features. That is, the selectively deposited material may mitigate stochastically-driven irregularities, such as line roughness, resist height thinning, line thinning, LER, LWR, resist wiggling, line breaks, and others.

The advantages of selective deposition may also be achieved for a larger variety of materials than conventional methods. Additionally, the selective deposition process is a direct process, capable of selectively depositing the using a species of positive ion. The selective deposition processes may also be advantageously implemented without having to remove the substrate from the processing chamber, such as in situ during an etching process. For example, the selective deposition processes described herein, may be performed in an etching system, such as a plasma etching system. Additionally, the deposition processes may have the advantage of being capable of integration into current process flows, such as etch processes.

Embodiments provided below describe various systems and methods for selective deposition processes, and in particular, to systems and methods for selectively depositing a material on upper surfaces of a patterned layer using differential surface charging. The following description describes the embodiments. FIG. 1 is used to describe an example selective deposition process. Two more example selective deposition processes are described using FIGS. 2 and 3. A surface charging step of an example selective deposition process is described using FIG. 4. A selective deposition step of a selective deposition process is described using FIG. 5. Various timing diagrams of example selective deposition processes are described using FIGS. 6 and 7. An example plasma system that can be used to perform selective deposition processes is described using FIG. 8. Two example methods of selectively depositing a material on upper surfaces of a patterned layer are described using FIGS. 9 and 10.

FIG. 1 illustrates an example selective deposition process that includes a surface charging step to negatively charge upper surfaces of a patterned layer and a deposition step to selectively deposit a material on the upper surfaces in accordance with embodiments of the invention.

Referring to FIG. 1, a selective deposition process 100 begins with a substrate 110 that includes a patterned layer 112 overlying an underlying layer 118. The patterned layer 112 has been formed such that it has various recesses 116 with upper surfaces 113 and sidewalls 115 revealing bottom surfaces 117 below (i.e., exposed surfaces of the underlying layer 118). The underlying layer 118 may be any suitable material (e.g., a dielectric material, such as an oxide or a nitride, but any material is possible including metal materials, semiconductor materials, etc.). Of course, the substrate 110 may (and very often does) include various other layers below the underlying layer 118. An extraction grid 140 separates the patterned layer 112 from a remote chamber 170. At an initial state 108 of the selective deposition process 100, the patterned layer 112 has been formed on the underlying layer 118.

During a surface charging step 101 of the selective deposition process 100, the entire patterned layer 112 (including the upper surfaces 113, sidewalls 115, and the bottom surfaces 117) is exposed to electrons 122 extracted from a remote electron source 132 in the remote chamber 170. For example, the electrons 122 may be generated using any suitable method (e.g., in a plasma, thermionic, field emission, etc.). The electrons 122 are extracted through the extraction grid 140 (which may be coupled to an optional ground potential 142 or left electrically floating). For example, the extraction grid 140 is configured to keep the electrons 122 of the remote electron source 132 separate from the patterned layer 112 while they are being generated (e.g., while they potentially have high energy or directionality). The remote electron source 132 and the extraction grid 140 are configured to provide the electrons at the patterned layer 112 with low energy and substantially directionless motion (e.g., substantially random thermal motion).

A positive DC bias 144 may be applied at the substrate 110 during the surface charging step 101 (e.g., to a substrate holder supporting the substrate). The positive DC bias 144 is configured to be a charging potential (e.g., low positive voltage that imparts little downward velocity to the electrons) that is sufficient to collect the electrons 122 as surface charge at the upper surfaces 113, as shown. In various embodiments, the positive DC bias 144 is less than about 50 V, and is less than about 30 V in some embodiments. In on embodiment, the positive DC bias 144 is between about 10 V and about 30 V.

The electrons 122 may diffuse through the extraction grid 140 and then experience the low positive potential from the positive DC bias 144. The electrons 122 collect preferentially at the upper surfaces 113 relative to other surfaces (i.e., the sidewalls 115 and the bottom surfaces 117). For example, various factors may play a role in achieving this differential charging of the upper surfaces 113, such as the geometry of the patterned layer 112 (e.g., shading effects), the location of the upper surfaces 113 at the top of the patterned layer 112, the low energy of the electrons 122, the low voltage of the positive DC bias 144, collected charge in the bottom regions of the recesses 116, and others.

During a selective deposition step 102 of the selective deposition process 100, the entire patterned layer 112 (including the charged upper surfaces 113, the sidewalls 115, and the bottom surfaces 117) is exposed to positive ions 124 extracted from a remote ion source 134 in the remote chamber 170. The selective deposition process 100 is not limited by the type of remote ion source as long as the positive ions 124 are capable of being extracted through extraction grid 140 with the desired properties. In one embodiment, the remote ion source 134 is a remote plasma. Further, when the remote electron source 132 is also a remote plasma, the remote ion source 134 may be the same remote plasma as the remote electron source 132 in various embodiments. In other embodiments, two different plasma may be generated for the remote electron source 132 and the remote ion source 134. Additional details of these options are discussed in further detail in the following.

A negative DC bias 146 may be applied at the substrate 110 during the selective deposition step 102 (again, to a substrate holder supporting the substrate, for example). The negative DC bias 146 is configured to extract the positive ions 124, but is a low negative voltage configured to avoid accelerating the positive ions 124 past the charged upper surfaces 113 and to the sidewalls 115 and bottom surfaces 117 of the recesses 116. That is, whatever downward velocity is acquired by the positive ions 124 from the negative DC bias 146 is low enough to allow the positive ions 124 to be attracted by the electrons 122 of the charged upper surfaces 113 resulting in selective deposition of a deposited material 120 at the upper surfaces 113, as shown in a post deposition state 109. In various embodiments, the magnitude of the negative DC bias 146 is less than about 50 V, and is less than about 30 V in some embodiments. In one embodiment, the magnitude of the negative DC bias 146 is between about 10 V and about 30 V.

In some cases, it may be desirable to provide the negative DC bias 146 as a series of pulses (e.g., to control surface charging from the positive ions 124, control the flux of the positive ions 124, etc.). Additionally, positive pulses may also be included, such as by interspersing the positive bias pulses between the negative bias pulses to form a bipolar pulse train.

The deposited material 120 may be any desired material as long as it may be deposited using positive ions that can be generated by a remote ion source 134. Advantageously, the deposited material 120 may be a polymeric material that is compatible with a corresponding etching process. In various embodiments, the deposited material 120 is a carbon-based material. In one embodiment, the deposited material 120 is a fluorocarbon polymer. In another embodiment, the deposited material 120 is a hydrofluorocarbon polymer. Of course, many materials suitable for use as the deposited material 120 may be combinations of many elements, and may include carbon. Further, carbon is by no means required as a component of the deposited material 120, as other elements may also make up or be included in the positive ions 124 and/or the deposited material 120, such as silicon, boron, nitrogen, oxygen, halogens (chlorine, iodine, and others), metals (aluminum, magnesium, and others), just to name a few.

The surface charging step 101 and the selective deposition step 102 may be perform on any timescale appropriate for the desired amount of charge (during the surface charging step 101) and the desired amount of the deposited material (during the selective deposition step 102). In some cases, the timescales may be influenced by considerations such as the flux of the electrons 122 in the surface charging step 101 and the flux of the positive ions 124 in the selective deposition step 102. For example, the surface charging step 101 may be made longer or shorter to accumulate the desired amount of charge on the upper surfaces 113 (which may have a practical upper limit after which no additional charge accumulates or charge begins to undesirably accumulate on the sidewalls 115 or the bottom surfaces 117. If the amount of positive charge accumulated during the selective deposition step 102 is higher than that of the surface charging step 101 then the desired effects of selective deposition using differential charging may be lost. Therefore, the duration of the selective deposition step 102 may be chosen to ensure that the positive charge at the upper surfaces 113 is limited to a desired percentage of the negative charge collected during the surface charging step 101.

Another practical consideration related to the timescales of the surface charging step 101 and the selective deposition step 102 are the speed that the remote electron source 132 and the remote ion source 134 can generate the electrons 122 and the positive ions 124, respectively. In some cases, additional time may be required to generate the electrons 122 and the positive ions 124 with the desired properties. One example, might be if the remote electron source 132 and the remote ion source 134 are different remote plasmas. The duration of the surface charging step 101 and the selective deposition step 102 may then be influenced by the gas switching speed, which may be slower than the charging and deposition processes.

The patterned layer 112 may be formed by patterning a resist such as a photoresist. In various embodiments, the patterned layer 112 is a metal oxide resist (MOR) photoresist. In one embodiment, the patterned layer 112 is a tin oxide-based mask formed by patterning a tin oxide-based photoresist (e.g., using EUV lithography). The substrate 110 may include various layers ranging from amorphous silicon (aSi) to organic layers (e.g., an OPL) to oxides (e.g., silicon dioxide ($SiO_2$) such as low temperature oxide (LTO), tetraethyl orthosilicate (TEOS), aluminum oxide ($Al_2O_3$), etc.) to nitrides (e.g., silicon nitride ($Si_3N_4$)) and metals. Moreover, the substrate 110 may be any suitable substrate, such as an insulating, conducting, or semiconducting substrate with one or more layers disposed thereon. For example, the substrate 110 may be a semiconductor wafer, such as a silicon wafer, and include various layers, structures, and devices (e.g., forming integrated circuits). In one embodiment, the substrate 110 includes silicon. In another embodiment, the substrate 110 includes silicon germanium (SiGe). In still another embodiment, the substrate 110 includes gallium arsenide (GaAs). Of course, many other suitable materials, semiconductor or otherwise, may be included in the substrate 110 as may be apparent to those of skill in the art.

Figure 2:
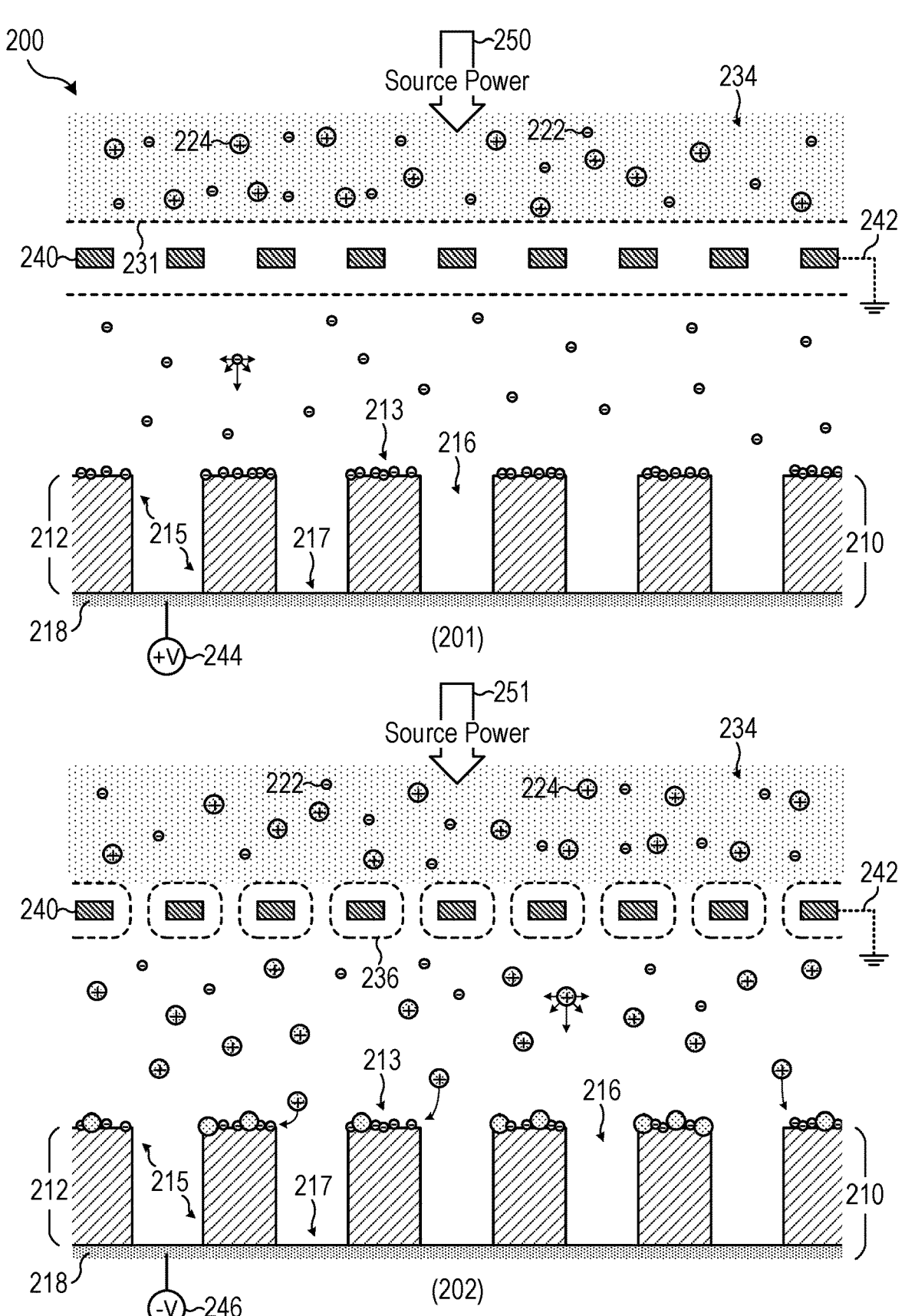
FIG. 2 illustrates an example selective deposition process that includes a surface charging step and a selective deposition step, where the remote electron source and the remote ion source are remote plasmas in accordance with embodiments of the invention.

FIG. 2 illustrates an example selective deposition process that includes a surface charging step and a selective deposition step, where the remote electron source and the remote ion source are remote plasmas in accordance with embodiments of the invention. The selective deposition process of FIG. 2 may be a specific implementation of other selective deposition processes described herein such as the selective deposition process of FIG. 1, for example. Similarly labeled elements may be as previously described.

Referring to FIG. 2, a selective deposition process 200 includes a surface charging step 201 and a selective deposition step 202. It should be noted that here and in the following a convention has been adopted for brevity and clarity wherein elements adhering to the pattern [x01] where 'x' is the figure number may be related implementations of a surface charging step in various embodiments. For example, the surface charging step 201 may be similar to the surface charging step 101 except as otherwise stated. An analogous convention has also been adopted for other elements as made clear by the use of similar terms in conjunction with the aforementioned numbering system.

During the surface charging step 201, a patterned layer 212 including upper surfaces 213, sidewalls 215, and bottom surfaces 217 is exposed to electrons 222 extracted from a remote plasma 234. The patterned layer 212 is disposed over an underlying layer 218 of a substrate 210. A charging source power 250 is applied to the remote plasma 234 and the electrons 222 are extracted through an extraction grid 240, which again may be coupled to an optional ground potential 242 or left electrically floating. As shown, the charging source power 250 is configured to generate the remote plasma 234 and form a plasma sheath 231 at the interface between the remote plasma 234 and the extraction grid 240. The charging source power 250 is applied at a power level that results in a plasma sheath 231 is substantially continuous which may repel positive ions 224 that may be present in the remote plasma 234. A positive DC bias 244 is applied at the substrate 210 during the surface charging step 201 and is configured to be a charging potential sufficient to collect the electrons 222 as surface charge at the upper surfaces 213.

During the selective deposition step 202, the patterned layer 212 is exposed the positive ions 224 extracted from remote plasma 234. A deposition source power 251 is now applied to the remote plasma 234, which differs from the charging source power 250 in that it is higher than the charging source power 250. Specifically, the deposition source power 251 results in a molded plasma sheath 236 that conforms around the structure of the extraction grid 240 (due to reduced thickness compared to the plasma sheath 231 of the surface charging step 201). The molded plasma sheath 236 allows the positive ions 224 to be extracted through the extraction grid 240. A negative DC bias 246 is applied at the substrate 210 during the selective deposition step 202 and is configured to extract the positive ions 224 while avoiding accelerating the positive ions 224 past the charged upper surfaces 213 to the sidewalls 215 and bottom surfaces 217 of the recesses 216. As shown, the molded plasma sheath 236 also allows some of the electrons 222 to pass through the extraction grid 240, but the negative DC bias 246 may advantageously repel them away from the upper surfaces 213.

The size of the extraction grid 240 may be selected to allow the formation of the plasma sheath 231 and the molded plasma sheath 236 respectively. For this reason, the size of the openings on the extraction grid 240 may depend on a variety of factors. As an example, the size of the openings of the extraction grid 240 may be on the order of a millimeter. For example, the opening size of the extraction grid 240 is greater than about 500 μm in some embodiments, and is about 900 μm in one embodiment.

The remote plasma 234 may be any suitable type of plasma. In various embodiments, the remote plasma 234 is a polymer generating plasma, and may be a plasma used for etching the underlying layer 218 in some embodiments. In one embodiment, the remote plasma 234 is a fluorocarbon plasma, including fluorocarbon species (e.g., CF species, CHF species, etc.) In some implementations, the remote plasma 234 in the surface charging step 201 and the selective deposition step 202 are different plasmas (i.e., generated using different source gases). This option will be discussed more fully in reference to FIG. 3 below.

Additional gases may be included along with the source gas used to produce the electrons 222 and/or the positive ions 224. Specifically, the remote plasma 234 may include one or more carrier gases, stabilizing gases, supporting gases, and others. For example, a noble gas such as argon may be included as a carrier gas (or may also be used as a part of the source gas, such as to produce the electrons 222, for example). Relatively inert gases such as nitrogen may also be used as a carrier gas (or for another purpose). Reactive gases may also be included, such as hydrogen or oxygen. Indeed, as long as the electrons 222 and the positive ions 224 are generated with appropriate properties within the remote plasma 234, any desired gas may be included, as may be apparent to those of skill in the art.

Figure 3:
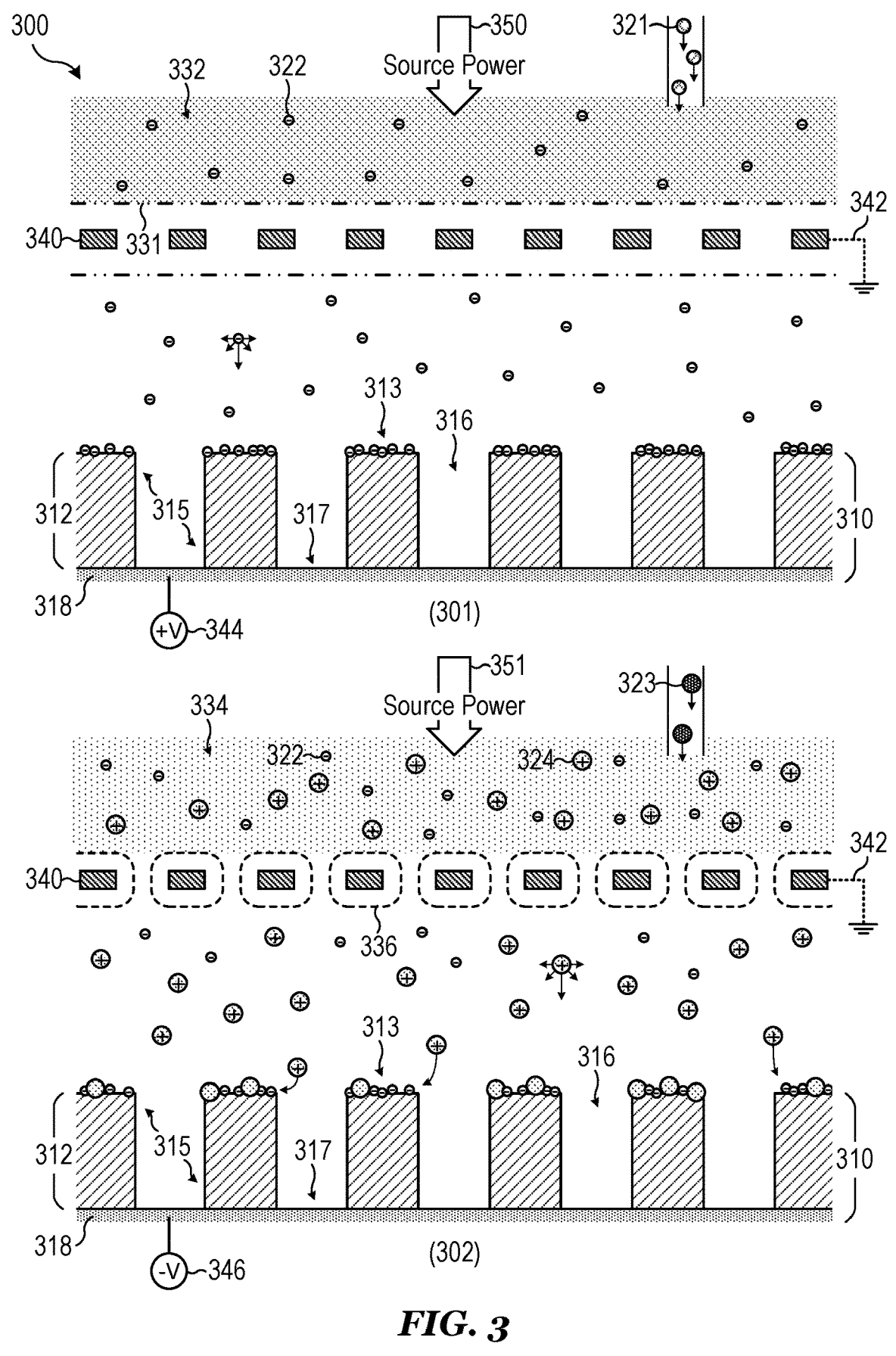

FIG. 3 illustrates an example selective deposition process that includes a surface charging step and a selective deposition step, where the remote electron source and the remote ion source are different remote plasmas in accordance with embodiments of the invention. The selective deposition process of FIG. 3 may be a specific implementation of other selective deposition processes described herein such as the selective deposition process of FIG. 2, for example. Similarly labeled elements may be as previously described.

Referring to FIG. 3, a selective deposition process 300 includes a surface charging step 301 and a selective deposition step 302. As before, during the surface charging step 301, a patterned layer 312 including upper surfaces 313, sidewalls 315, and bottom surfaces 317 is exposed to electrons 322 extracted from a remote electropositive plasma 332 that is generated by applying a charging source power 350 to an electron source gas 321. The patterned layer 312 is disposed over an underlying layer 318 of a substrate 310. The electrons 322 are extracted through a plasma sheath 331 and an extraction grid 340 (coupled to an optional ground potential 342 or left electrically floating). A positive DC bias 344 is applied at the substrate 310 during the surface charging step 301 and is configured to be a charging potential sufficient to collect the electrons 322 as surface charge at the upper surfaces 313.

During the selective deposition step 302, the patterned layer 312 is exposed to positive ions 324 extracted from a remote polymerizing plasma 334 (e.g., a fluorocarbon plasma). A deposition source power 351 is applied to an ion source gas 323 to generate the remote polymerizing plasma 334 resulting in a molded plasma sheath 336 at the extraction grid 340. A negative DC bias 346 is applied at the substrate 310 during the selective deposition step 302 and is configured to extract the positive ions 324 while avoiding accelerating the positive ions 324 past the charged upper surfaces 313. It should be noted that the remote electropositive plasma 332 includes positive ions (as well as potentially other plasma species) that were not shown to avoid confusion with the positive ions 324. That is, ions in the remote electropositive plasma 332 remain above the extraction grid 340 and are not the same as the positive ions 324.

In contrast the to the selective deposition process 200 of FIG. 2, the surface charging step 301 and the selective deposition step 302 utilize different plasmas (i.e., plasmas generated using different source gases). Specifically, the remote electropositive plasma 332 is generated using the electron source gas 321, which may comprise argon, such as pure argon gas. Meanwhile, the remote polymerizing plasma 334 may be any suitable type of plasma with the positive ions 324 that are used to selectively deposit a material on the upper surfaces 313.

Figure 4:
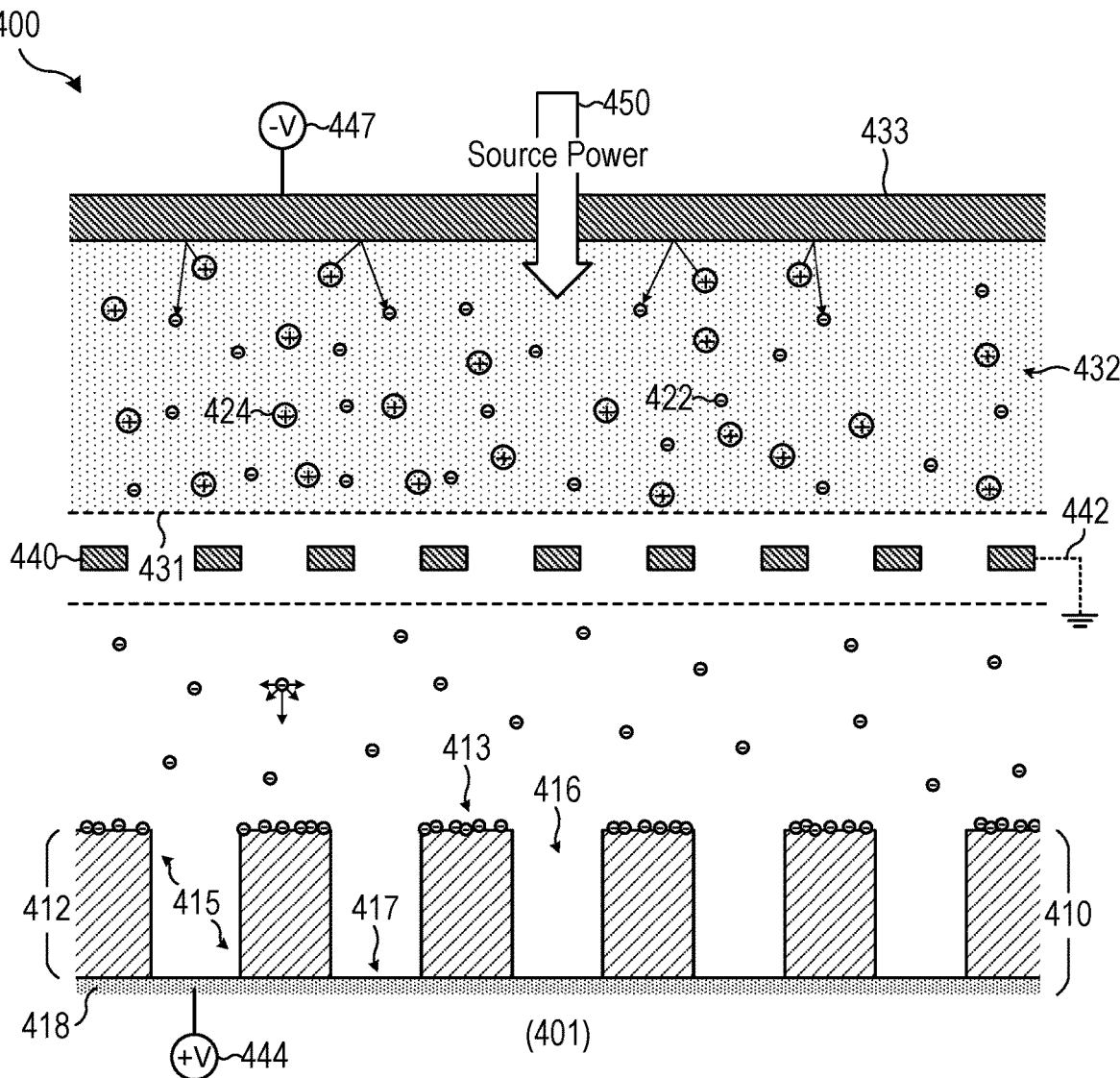
FIG. 4 illustrates a surface charging step of an example selective deposition process, where the remote electron source is a direct current superposition plasma in accordance with embodiments of the invention.

FIG. 4 illustrates a surface charging step of an example selective deposition process, where the remote electron source is a direct current superposition plasma in accordance with embodiments of the invention. The surface charging step of FIG. 4 may be included in other selective deposition processes described herein such as the selective deposition process of FIG. 1, for example. Similarly labeled elements may be as previously described.

Referring to FIG. 4, a surface charging step 401 of a selective deposition process 400 is similar to the surface charging step 201 of FIG. 2, except that in this specific implementation, direct current superposition (DCS) is used to generate all or some of the electrons by applying a DCS potential 447 to a DCS electrode 433. A patterned layer 412 including upper surfaces 413, sidewalls 415, and bottom surfaces 417 is exposed to electrons 422 extracted from the resulting remote DCS plasma 432 (including the electrons 422 and positive ions 424) that is generated by applying a charging source power 450 (e.g., to the DCS electrode 433 or coupled through other means such as to another electrode or to a resonant structure, radio frequency (RF) antenna, etc.). The patterned layer 412 is disposed over an underlying layer 418 of a substrate 410. The electrons 422 are extracted through a plasma sheath 431 and an extraction grid 440 (coupled to an optional ground potential 442 or left electrically floating). A positive DC bias 444 is applied at the substrate 410 during the surface charging step 401 and is configured to be a charging potential sufficient to collect the electrons 422 as surface charge at the upper surfaces 413.

Figure 5:
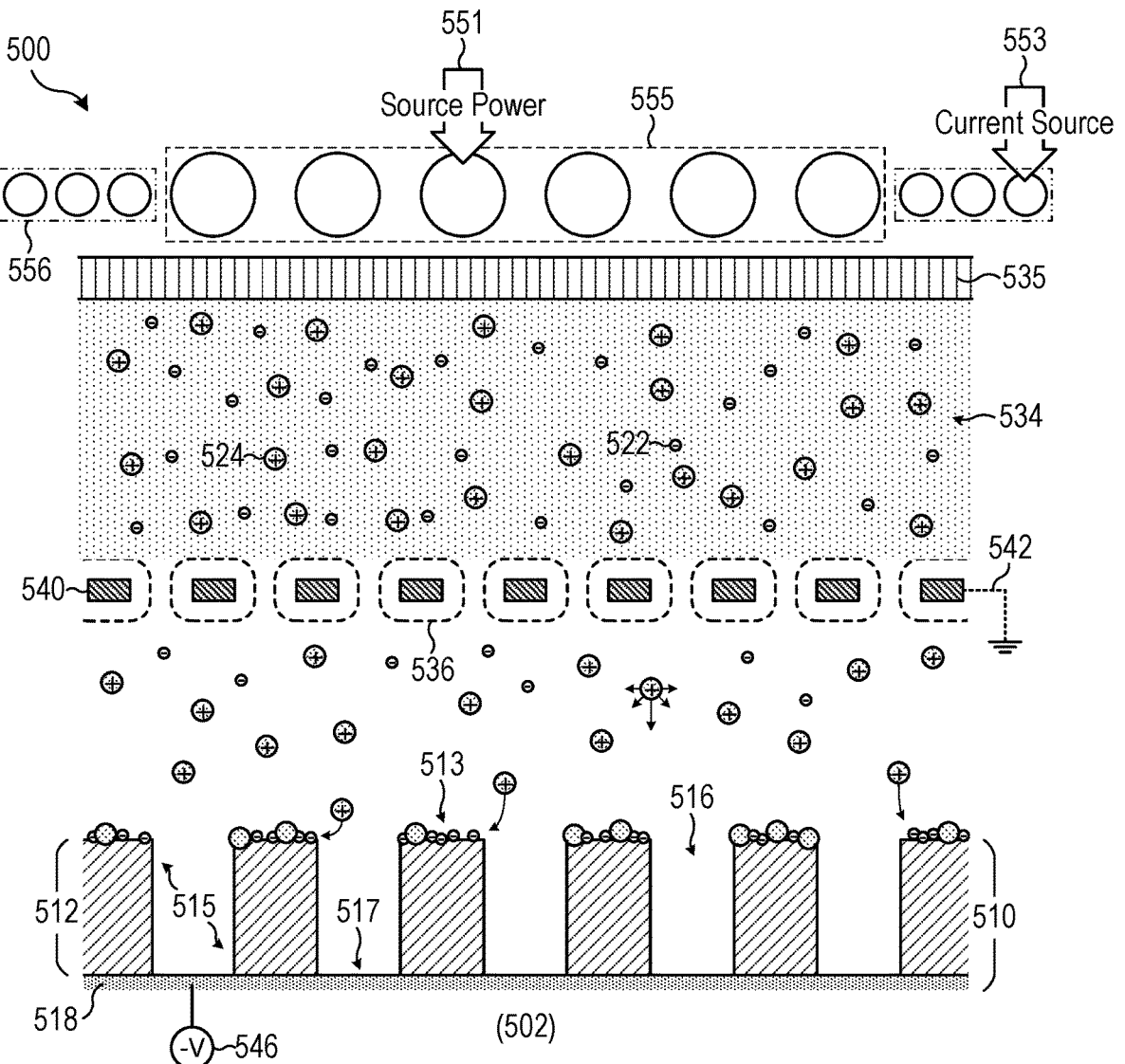
FIG. 5 illustrates a selective deposition step of an example selective deposition process, where the remote ion source is a magnetized plasma in accordance with embodiments of the invention.

FIG. 5 illustrates a selective deposition step of an example selective deposition process, where the remote ion source is a magnetized plasma in accordance with embodiments of the invention. The selective deposition step of FIG. 5 may be included in other selective deposition processes described herein such as the selective deposition process of FIG. 1, for example. Similarly labeled elements may be as previously described.

Referring to FIG. 5, a selective deposition step 502 of a selective deposition process 500 is similar to the selective deposition step 202 of FIG. 2, except that in this specific implementation, a remote magnetized plasma 534 is generated by applying deposition source power 551 to a source electrode 555 while applying a pulsed current source 553 to an electromagnet 556. For example, the electromagnet 556 may be a planar coil (as shown), a helical coil surrounding the remote magnetized plasma 534, or other configurations. While the source electrode 555 is shown as an inductive source electrode (a planar coil), other configurations are also possible, such as helical coil, or even a capacitive source electrode such as an upper electrode (for example if the electromagnet 556 is implemented as a helical coil).

A patterned layer 512 including upper surfaces 513, sidewalls 515, and bottom surfaces 517 is exposed to positive ions 524 extracted from the remote magnetized plasma 534 The patterned layer 512 is disposed over an underlying layer 518 of a substrate 510. The positive ions 524 are extracted through molded plasma sheath 536 and an extraction grid 540 (coupled to an optional ground potential 542 or left electrically floating). A negative DC bias 546 is applied at the substrate 510 during the selective deposition step 502 and is configured to extract the positive ions 524 while avoiding accelerating the positive ions 524 past the charged upper surfaces 513.

Figure 6:
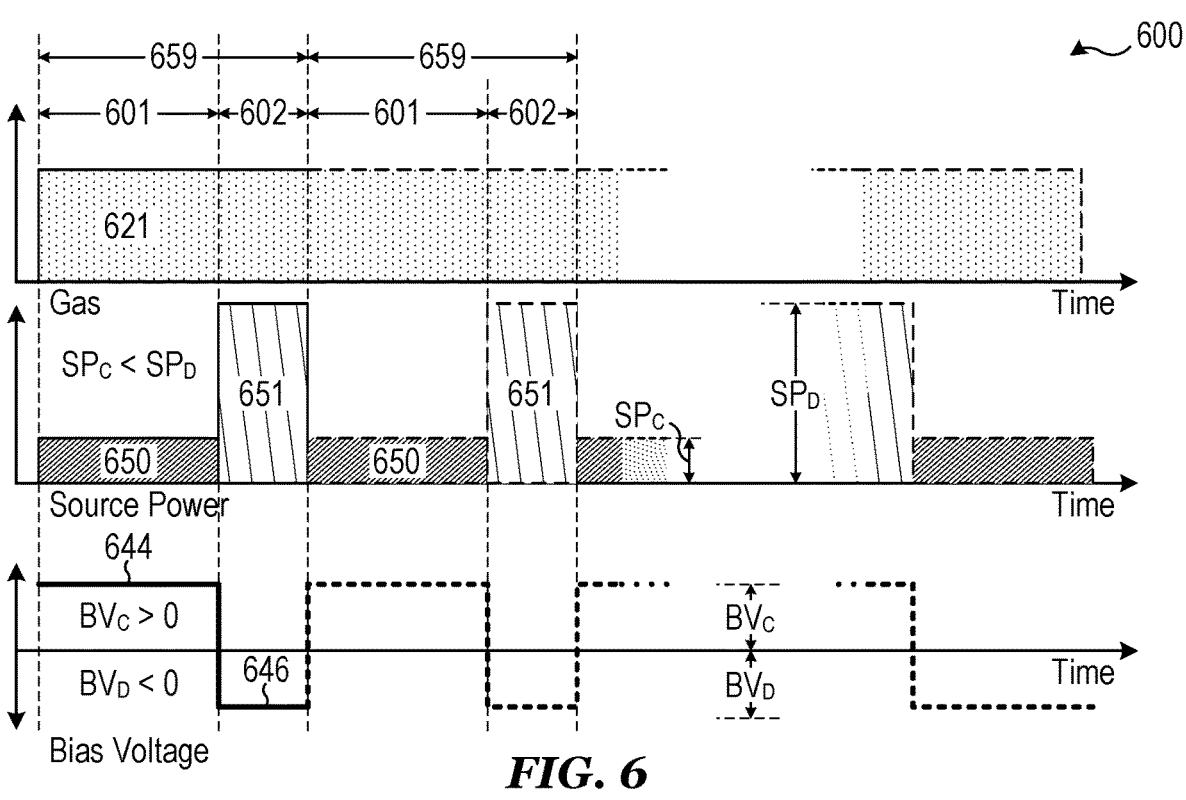
FIG. 6 illustrates a timing diagram of an example selective deposition process in accordance with embodiments of the invention.

FIG. 6 illustrates a timing diagram of an example selective deposition process in accordance with embodiments of the invention. The timing diagram of FIG. 6 may correspond with any of the selective deposition processes described herein such as the selective deposition process of FIG. 1, for example. Similarly labeled elements may be as previously described.

Referring to FIG. 6, a timing diagram 600 of an example selective deposition process shows timing for a source gas 621, charging source power 650, deposition source power 651, positive DC bias 644, and negative DC bias 646. As before, the selective deposition process includes a surface charging step 601 and a selective deposition step 602. In some embodiments, the surface charging step 601 and the selective deposition step 602 may be repeated as part of a cycle 659 (e.g., when the amount of the selectively deposited material exceeds the amount of material that can be selectively deposited during a single combination of the surface charging step 601 and the selective deposition step 602 steps.

In this embodiment, the source gas 621 remains the same throughout the both the surface charging step 601 and the selective deposition step 602. The charging source power 650 ($SP_C$) is less than the deposition source power 651 ($SP_D$), which may advantageously result in the desired sheath effects at the extraction grid. In one embodiment, the charging source power 650 is less than 200 W and the deposition source power 651 is greater than 200 W. The charging source power 650 may be in the range of about 10 W and about 200 W. The deposition source power 651 may be in the range of about 500 W to about 2000 W.

During the surface charging step 601, the DC bias voltage is positive ($BV_C > 0$) while the DC bias voltage is negative ($BV_D$) during the selective deposition step 602. In some applications, the timescale of the cycle 659 may be faster because the same source gas 621 is used for both the surface charging step 601 and the selective deposition step 602. For example, the timescale of the cycle 659 may be on the order of milliseconds or even microseconds. However, longer timescales are also possible and will depend on the details of a given application.

As previously mentioned, the duration of the selective deposition step 602 may be shorter than that of the surface charging step 601. This may be because of the relative fluxes of the electrons and the positive ions during the respective steps. For example, it may be desirable to limit the amount of positive charge in the selective deposition step 602 relative to the amount of negative charge in the surface charging step 601. In various embodiments, the duration of the selective deposition step 602 may be selected to be between about 10% and about 50% of the duration of the surface charging step 601.

Figure 7:
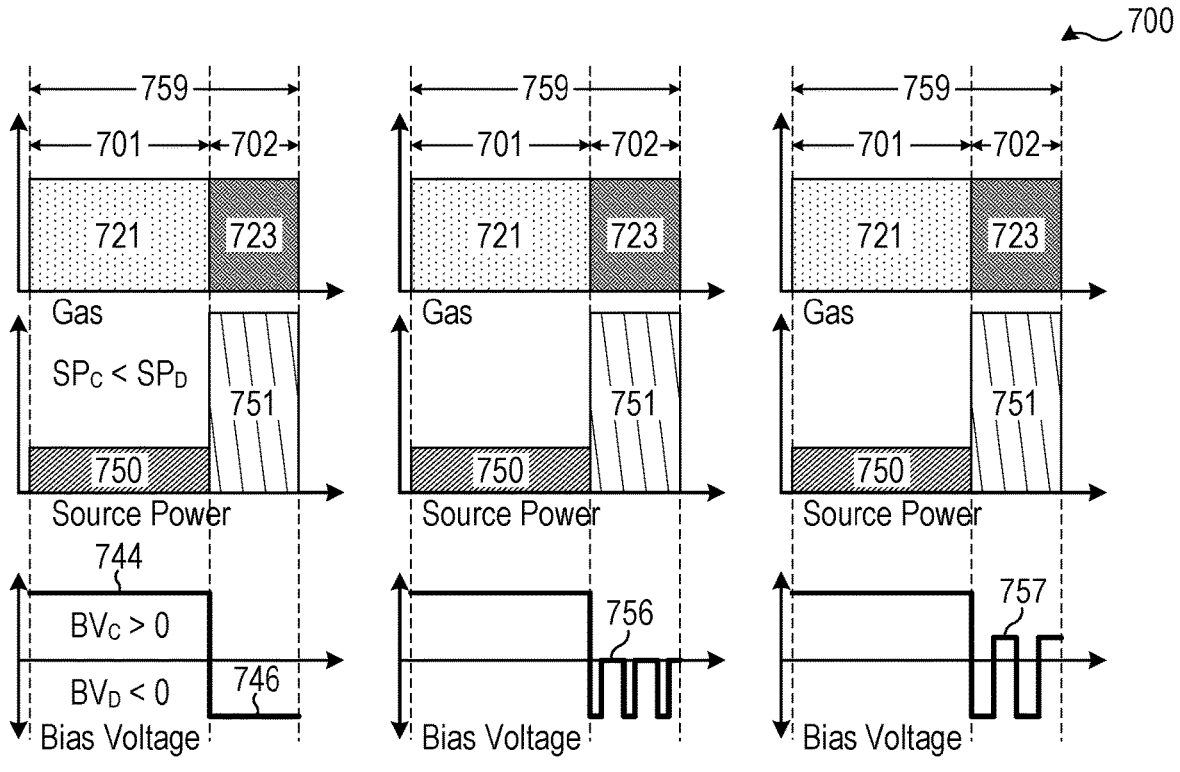
FIG. 7 illustrates several timing diagrams of example selective deposition processes in accordance with embodiments of the invention.

FIG. 7 illustrates several timing diagrams of example selective deposition processes in accordance with embodiments of the invention. The timing diagram of FIG. 7 may correspond with any of the selective deposition processes described herein such as the selective deposition process of FIG. 1, for example. Similarly labeled elements may be as previously described.

Referring to FIG. 7, timing diagrams 700 of example selective deposition processes show timing for source gas, charging source power 750, deposition source power 751, positive DC bias 744, and negative DC bias 746. In contrast to the timing diagram 600, the source gas is different between a surface charging step 701 (an electron source gas 721) and a selective deposition step 702 (an ion source gas 723). In addition to the specific implementation of different source gases, two alternative negative DC bias implementations are also qualitatively illustrated in the timing diagrams 700. For example, the negative DC bias 746 may be applied as a series of negative bias pulses 756. Additionally, the series of negative bias pulses 756 may be further modified to include positive pulses (e.g., to mitigate charging even further) so that the negative DC bias 746 is applied as a series of bipolar pulses 757.

Figure 8:
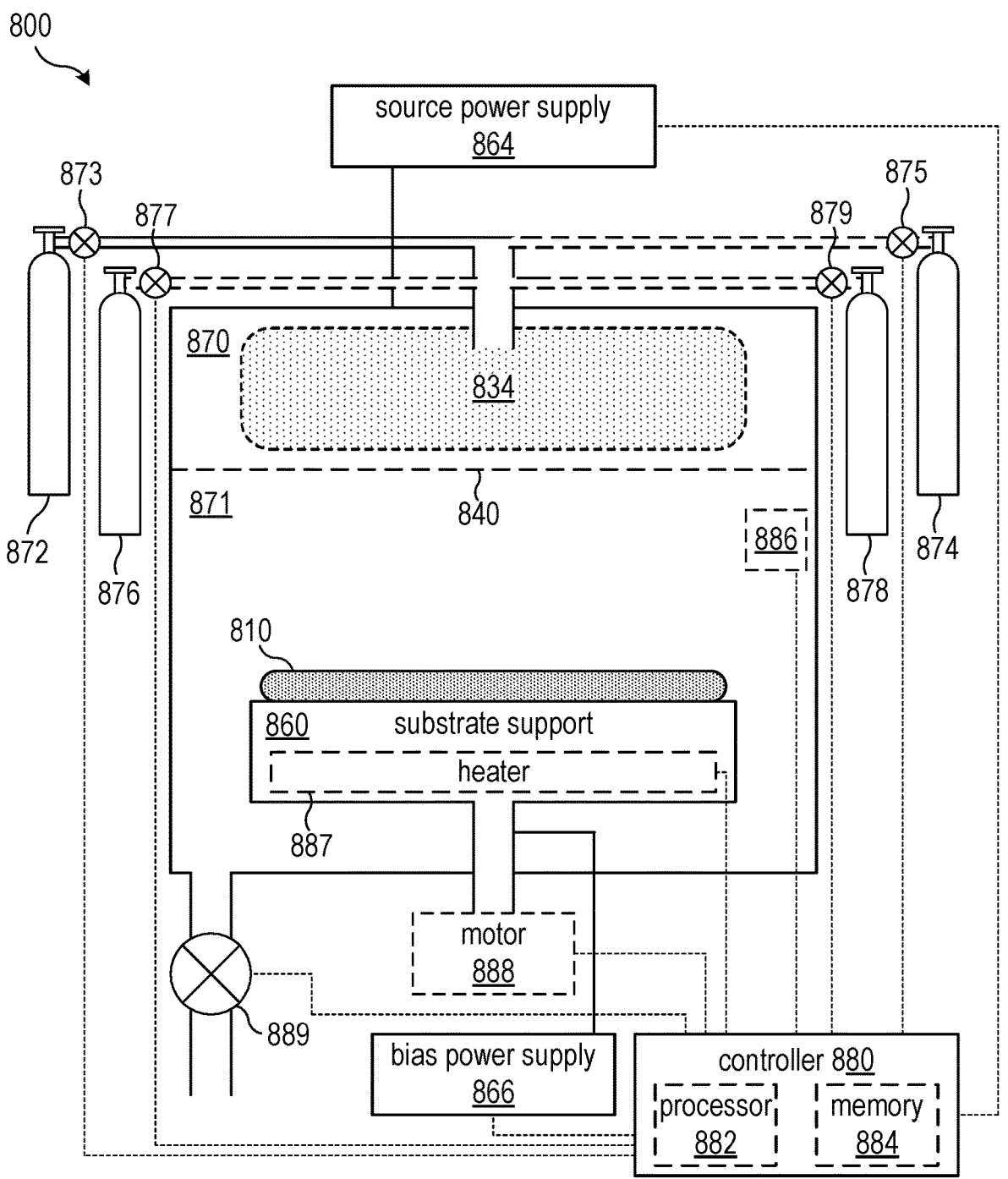
FIG. 8 illustrates an example plasma system that includes a remote plasma chamber and a process chamber within which selective deposition processes including surface charging step and a selective deposition step may be performed in accordance with embodiments of the invention.

FIG. 8 illustrates an example plasma system that includes a remote plasma chamber and a process chamber within which selective deposition processes including surface charging step and a selective deposition step may be performed in accordance with embodiments of the invention. The deposition system of FIG. 8 may be used to perform any of the example selective deposition processes described herein such as the selective deposition process of FIG. 1, for example. Similarly labeled elements may be as previously described.

Referring to FIG. 8, a plasma system 800 (e.g., a plasma deposition system, and may also be an etching system, such as a plasma etching system like an RIE etching system) includes a substrate support 860 disposed within a processing chamber 871, such as a plasma etching chamber, and configured to support a substrate 810. The processing chamber 871 is separated from a remote plasma chamber 870 by an extraction grid 840 (which may be grounded or electrically floating). A deposition gas source 872 and an optional charging gas source 874 are fluidically coupled to the remote plasma chamber 870 through a deposition valve 873 and an optional charging valve 875 respectively. Additional gas sources and valves may also be included in the plasma system 800. For example, an optional additional gas source 876 may be fluidically coupled to the remote plasma chamber 870 through an optional additional gas valve 877 (an additional gas may be any type of gas, such as a carrier gas, and multiple additional gases may be included) while an optional etch gas source 878 may be fluidically coupled to the remote plasma chamber 870 through an optional etch gas valve 879. An exhaust valve 889 is included to evacuate the processing chamber 871 (and or the remote plasma chamber 870) during the plasma process.

The plasma system 800 is configured to generate a remote plasma 834 during any or all of the steps of a plasma process (e.g., during a surface charging step, a selective deposition step, a plasma etching process, such as an RIE process, etc.). A source power supply 864 is configured to couple source power to the remote plasma chamber 870 in order to generate the remote plasma 834. Additionally, a bias power supply 866 is also included that is configured to supply bias power to the substrate support 860 (and the substrate 810). The processing chamber 871 may be any suitable processing chamber, such as an etching chamber (e.g., an RIE chamber, a capacitively couple plasma (CCP) etching chamber, an inductively coupled plasma (ICP) etching chamber), a deposition chamber (e.g., a CVD chamber, ALD chamber, MLD, chamber), and others.

An optional temperature monitor 886 may be included to monitor and/or aid in controlling the temperature of the substrate 810 and the environment in the processing chamber 871. An optional heater 887 may be included to elevate the temperature of the substrate 810 above the equilibrium temperature at the substrate 810 during the deposition process. Alternatively, the optional heater 887 may optionally be a cooler to decrease the temperature of the substrate 810 below equilibrium. An optional motor 888 may also be included to improve process uniformity.

A controller 880 is operationally coupled to the valves (deposition valve 873, the optional charging valve 875, the optional additional gas valve 877, the optional etch gas valve 879, etc.), and may be operationally coupled to any of the optional temperature monitor 886, the optional heater 887, the optional motor 888, and the exhaust valve 889. The controller 880 may include a processor 882 and a memory 884 (i.e., a non-transitory computer-readable medium) that stores a program including instructions that, when executed by the processor 882, perform a selective deposition process. For example, the memory 884 may have volatile memory (e.g., random access memory (RAM)) and non-volatile memory (e.g., flash memory). Alternatively, the program may be stored in physical memory at a remote location, such as in cloud storage. The processor 882 may be any suitable processor, such as the processor of a microcontroller, a general-purpose processor (such as a central processing unit (CPU), a microprocessor, a field-programmable gate array (FPGA), an application-specific integrated circuit (ASIC), and others.

Figure 9:
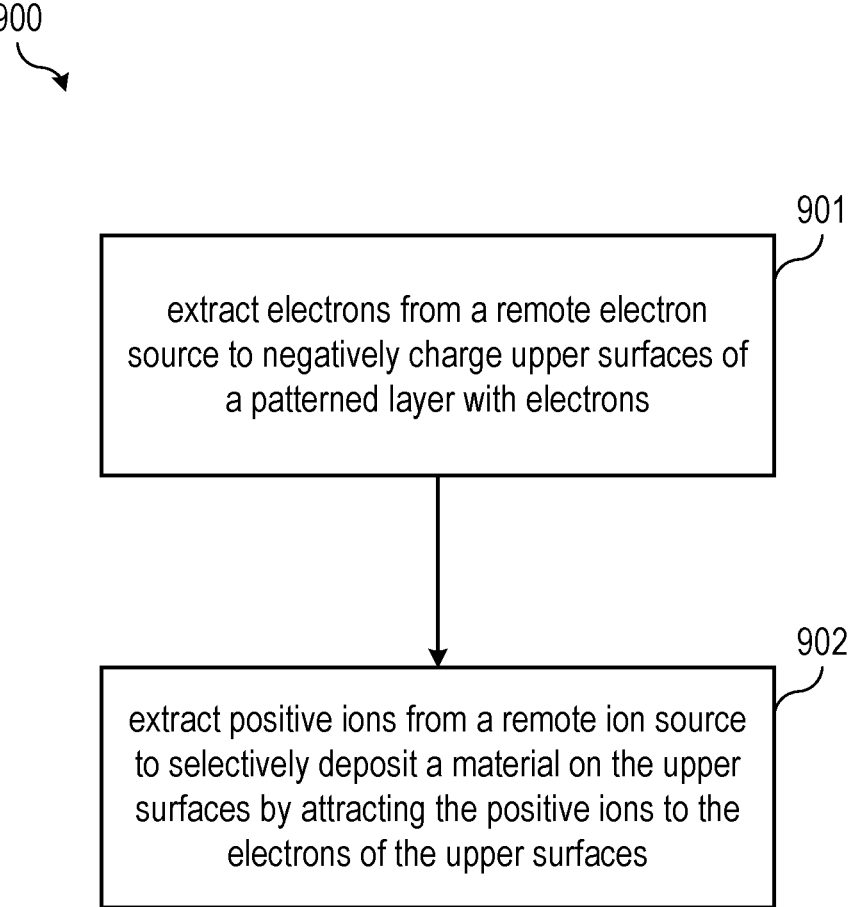
FIG. 9 illustrates an example method of selectively depositing a material on upper surfaces of a patterned layer in accordance with embodiments of the invention.

FIG. 9 illustrates an example method of selectively depositing a material on upper surfaces of a patterned layer in accordance with embodiments of the invention. The method of FIG. 9 may be combined with other methods and performed using the systems and apparatuses as described herein. For example, the method of FIG. 9 may be combined with any of the embodiments of FIGS. 1-8 and 10.

Referring to FIG. 9, a method 900 of selectively depositing a material on upper surfaces of a patterned layer includes a surface charging step 901 of extracting electrons from a remote electron source to negatively charge upper surfaces of a patterned layer with the electrons. For example, the electrons may be extracted from the remote electron source (e.g., a remote plasma source) by applying a positive DC bias at a substrate that includes the patterned layer (such as applied to a substrate support supporting the substrate). Positive ions are then extracted from a remote ion source in a selective deposition step 902 to selectively deposit a material on the upper surfaces by attracting the positive ions to the electrons of the upper surfaces. A negative DC bias may be applied at the substrate to extract the positive ions from the remote ion source (e.g., a remote plasma source, which may be the same or different than the remote electron source).

FIG. 10 illustrates another example method of selectively depositing a material on upper surfaces of a patterned layer in accordance with embodiments of the invention. The method of FIG. 10 may be combined with other methods and performed using the systems and apparatuses as described herein. For example, the method of FIG. 10 may be combined with any of the embodiments of FIGS. 1-9. Although shown in a logical order, the arrangement and numbering of the steps of FIG. 10 are not intended to be limited. The method steps of FIG. 10 may be performed in any suitable order or concurrently with one another as may be apparent to a person of skill in the art.

Referring to FIG. 10, a method 1000 of selectively depositing a material on upper surfaces of a patterned layer includes a surface charging step 1001 of negatively charging upper surfaces of a patterned layer with electrons. During the surface charging step 1001, a plasma generation step 1003 of applying source power to generate plasma comprising the electrons in a remote plasma chamber and an electron extraction step 1004 of applying a positive direct current (DC) bias at the patterned layer are performed concurrently. The remote plasma chamber is separated from the patterned layer by an extraction grid.

The method 1000 further includes a selective deposition step 1002 of selectively depositing a material on the upper surfaces with positive ions. During the selective deposition step 1002, a plasma generation step 1005 of applying source power to generate plasma comprising the positive ions in the remote plasma chamber and an ion extraction step 1006 of applying a negative DC bias at the patterned layer are performed concurrently. The power level of the source power during the surface charging step 1001 is lower than the power level of the source power during the selective deposition step 1002.

The extraction grid may be grounded or electrically floating. For example, in one or both of the surface charging step 1001 and the selective deposition step 1002, an optional grounding step 1007 of applying a ground potential to the extraction grid may be performed concurrently with the other respective steps. The ground potential may be continuously coupled to the extraction grid (e.g., permanently) or may be applied during desired steps of the method 1000.

Example embodiments of the invention are summarized here. Other embodiments can also be understood from the entirety of the specification as well as the claims filed herein.

Example 1. A method including: extracting electrons from a remote electron source to negatively charge upper surfaces of a patterned layer with the electrons; and extracting positive ions from a remote ion source to selectively deposit a material on the upper surfaces by attracting the positive ions to the electrons of the upper surfaces.

Example 2. The method of example 1, where the remote electron source is a remote plasma including the electrons.

Example 3. The method of example 2, where the remote plasma is an electropositive plasma generated from pure argon gas.

Example 4. The method of one of examples 1 to 3, where the remote ion source is a remote plasma including the positive ions.

Example 5. The method of example 4, where the remote electron source is the same remote plasma as the remote ion source, the remote plasma further including the electrons.

Example 6. The method of example 4, where the remote plasma is a fluorocarbon plasma, and where the material selectively deposited on the upper surfaces is a carbon-based polymer.

Example 7. The method of one of examples 1 to 6, where: extracting the electrons from the remote electron source includes applying a ground potential to an extraction grid separating the remote electron source from the patterned layer, and applying a positive direct current (DC) bias at the patterned layer; and extracting the positive ions from the remote ion source includes applying the ground potential to the extraction grid, and applying a negative DC bias at the patterned layer.

Example 8. A method including: negatively charging upper surfaces of a patterned layer with electrons by concurrently applying source power having a first power level to generate plasma including the electrons in a remote plasma chamber separated from the patterned layer by an extraction grid, and applying a positive direct current (DC) bias at the patterned layer; and selectively depositing a material on the upper surfaces with positive ions by concurrently applying source power having a second power level greater than the first power level to generate plasma including the positive ions in the remote plasma chamber, and applying a negative DC bias at the patterned layer.

Example 9. The method of example 8, where applying the negative DC bias includes pulsing the negative DC bias as a series of negative bias pulses.

Example 10. The method of example 9, where each bias pulse of the series of negative bias pulses includes a pulse width less than about 5 ns.

Example 11. The method of one of examples 9 and 10, where the series of negative bias pulses is a bipolar pulse train, the series of negative bias pulses including positive bias pulses separating adjacent negative bias pulses.

Example 12. The method of one of examples 8 to 11, where the magnitude of both the positive DC bias and the negative DC bias is less than about 50 V.

Example 13. The method of example 12, where the negative DC bias is substantially the same as the plasma potential of the plasma.

Example 14. The method of one of examples 8 to 13, where the first power level is less than 200 W, and where the second power level is greater than 200 W.

Example 15. A plasma system including: a processing chamber; a remote plasma chamber configured to contain plasma including electrons and positive ions; an extraction grid separating the processing chamber and the remote plasma chamber; a substrate support disposed in the processing chamber and configured to support a substrate including a patterned layer fluidically coupled to the remote plasma chamber through the extraction grid; an electron source gas fluidically coupled to the remote plasma chamber through one or more valves; an ion source gas fluidically coupled to the remote plasma chamber through the one or more valves; a source power supply configured to generate the plasma in the remote plasma chamber; a direct current (DC) bias power supply electrically coupled to the substrate support; and a controller operatively coupled to the one or more valves, the DC bias power supply, and the source power supply, the controller including a processor and a non-transitory computer-readable medium storing a program including instructions that, when executed by the processor, perform a method including: negatively charging upper surfaces of a patterned layer with the electrons by concurrently applying source power from the source power supply to generate plasma including the electrons in a remote plasma chamber separated from the patterned layer, and applying a positive DC bias from the DC bias power supply to the substrate holder; and selectively depositing a material on the upper surfaces with positive ions by concurrently applying source power from the source power supply to generate plasma including the positive ions in the remote plasma chamber, and applying a negative DC bias from the DC bias power supply to the substrate holder.

Example 16. The plasma system of example 15, where negatively charging the upper surfaces further includes concurrently applying a ground potential to the extraction grid while applying the source power and the positive DC bias, and where selectively depositing the material further includes concurrently applying the ground potential to the extraction grid while applying the source power and the negative DC bias.

Example 17. The plasma system of example 15, where the extraction grid is electrically floating while negatively charging the upper surfaces and while selectively depositing the material.

Example 18. The plasma system of one of examples 15 to 17, where electron source gas and the ion source gas are the same gas.

Example 19. The plasma system of one of examples 15 to 18, further including: an electrode disposed in the remote plasma chamber, where negatively charging the upper surfaces further includes concurrently applying a negative DC superposition potential as a continuous wave potential or a series or negative DC pulses.

Example 20. The plasma system of one of examples 15 to 19, where selectively depositing the material further includes applying a magnetic field to the plasma in the remote plasma chamber while applying the source power and the negative DC bias.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma system comprising:
a processing chamber;
a remote plasma chamber configured to contain plasma comprising electrons and positive ions;
an extraction grid separating the processing chamber and the remote plasma chamber;
a substrate support disposed in the processing chamber and configured to support a substrate comprising a patterned layer;
at least one gas source coupled to the remote plasma chamber and configured to provide an electron source gas and an ion source gas to the remote plasma chamber through one or more valves;
a source power supply configured to generate the plasma in the remote plasma chamber;
a direct current (DC) bias power supply electrically coupled to the substrate support; and
a controller operatively coupled to the one or more valves, the DC bias power supply, and the source power supply, the controller comprising a processor and a non-transitory computer-readable medium storing a program including instructions that, when executed by the processor, perform a method comprising:
negatively charging upper surfaces of the patterned layer with the electrons by concurrently
applying source power from the source power supply to generate plasma comprising the electrons in the remote plasma chamber separated from the patterned layer, and
applying a positive DC bias from the DC bias power supply to the substrate support; and
selectively depositing a material on the upper surfaces with positive ions by concurrently
applying source power from the source power supply to generate plasma comprising the positive ions in the remote plasma chamber, and
applying a negative DC bias from the DC bias power supply to the substrate support.

2. The plasma system of claim 1,
wherein negatively charging the upper surfaces further comprises concurrently applying a ground potential to the extraction grid while applying the source power and the positive DC bias, and wherein selectively depositing the material further comprises concurrently applying the ground potential to the extraction grid while applying the source power and the negative DC bias.

3. The plasma system of claim 1, wherein the extraction grid is electrically floating while negatively charging the upper surfaces and while selectively depositing the material.

4. The plasma system of claim 1, wherein the electron source gas and the ion source gas are the same gas.

5. The plasma system of claim 1, further comprising:
an electrode disposed in the remote plasma chamber, wherein negatively charging the upper surfaces further comprises concurrently applying a negative DC superposition potential to the electrode as a continuous wave potential or a series or negative DC pulses.

6. The plasma system of claim 1, wherein selectively depositing the material further comprises applying a magnetic field to the plasma in the remote plasma chamber while applying the source power and the negative DC bias.

7. The plasma system of claim 1, wherein the electron source gas and the ion source gas are different gases.

8. The plasma system of claim 7, wherein the electron source gas is pure argon gas, and wherein the plasma comprising the electrons generated by applying the source power while negatively charging the upper surfaces is an electropositive plasma.

9. The plasma system of claim 8, wherein the ion source gas comprises carbon, and wherein the plasma comprising the positive ions generated by applying the source power while selectively depositing the material on the upper surfaces is a fluorocarbon plasma.

10. The plasma system of claim 1, wherein:
the source power is applied with a first power level to generate the plasma comprising the electrons while negatively charging the upper surfaces; and
the source power is applied at a second power level greater than the first power level to generate the plasma comprising the positive ions while selectively depositing the material on the upper surfaces.

11. The plasma system of claim 10, wherein applying the negative DC bias comprises pulsing the negative DC bias as a series of negative bias pulses.

12. The plasma system of claim 11, wherein each bias pulse of the series of negative bias pulses comprises a pulse width less than about 5 ns.

13. The plasma system of claim 11, wherein the series of negative bias pulses is a bipolar pulse train, the series of negative bias pulses comprising positive bias pulses separating adjacent negative bias pulses.

14. The plasma system of claim 10, wherein the magnitude of both the positive DC bias and the negative DC bias is less than about 50 V.

15. The plasma system of claim 14, wherein the negative DC bias is substantially the same as the plasma potential of the plasma comprising the positive ions generated while selectively depositing the material.

16. The plasma system of claim 10, wherein the first power level is less than 200 W, and wherein the second power level is greater than 200 W.

17. A plasma system comprising:
a processing chamber;
a remote plasma chamber configured to contain plasma comprising electrons and positive ions;
an extraction grid separating the processing chamber and the remote plasma chamber;

a substrate support disposed in the processing chamber and configured to support a substrate comprising a patterned layer;

at least one gas source coupled to the remote plasma chamber and configured to provide an electron source gas and an ion source gas to the remote plasma chamber through one or more valves;

a source power supply configured to generate the plasma in the remote plasma chamber;

a direct current (DC) bias power supply electrically coupled to the substrate support; and a controller operatively coupled to the one or more valves, the DC bias power supply, and the source power supply, the controller comprising a processor and a non-transitory computer-readable medium storing a program including instructions that, when executed by the processor, perform a method comprising:

negatively charging upper surfaces of the patterned layer with the electrons by concurrently applying source power from the source power supply with a first power level to generate plasma comprising the electrons in the remote plasma chamber separated from the patterned layer, applying a positive DC bias from the DC bias power supply to the substrate support, and applying a ground potential to the extraction grid while applying the source power and the positive DC bias; and selectively depositing a material on the upper surfaces with positive ions by concurrently applying source power from the source power supply with a second power level greater than the first power level to generate plasma comprising the positive ions in the remote plasma chamber, applying a negative DC bias from the DC bias power supply to the substrate support, and applying the ground potential to the extraction grid while applying the source power and the negative DC bias.

18. The plasma system of claim 17, wherein:

the electron source gas and the ion source gas are different gases;

the electron source gas is pure argon gas; and the plasma comprising the electrons generated by applying the source power while negatively charging the upper surfaces is an electropositive plasma.

19. A plasma system comprising:

a processing chamber;

a remote plasma chamber configured to contain plasma comprising electrons and positive ions;

an extraction grid separating the processing chamber and the remote plasma chamber;

a substrate support disposed in the processing chamber and configured to support a substrate comprising a patterned layer;

at least one gas source coupled to the remote plasma chamber and configured to provide an electron source gas and an ion source gas to the remote plasma chamber through one or more valves;

a source power supply configured to generate the plasma in the remote plasma chamber;

a direct current (DC) bias power supply electrically coupled to the substrate support; and a controller operatively coupled to the one or more valves, the DC bias power supply, and the source power supply, the controller comprising a processor and a non-transitory computer-readable medium storing a program including instructions that, when executed by the processor, perform a method comprising:

negatively charging upper surfaces of the patterned layer with the electrons by concurrently applying source power from the source power supply to generate plasma comprising the electrons in the remote plasma chamber separated from the patterned layer, and applying a positive DC bias from the DC bias power supply to the substrate support to attract the electrons that pass through the extraction grid to the upper surfaces; and selectively depositing a material on the upper surfaces with positive ions by concurrently applying source power from the source power supply to generate plasma comprising the positive ions in the remote plasma chamber, and applying a negative DC bias from the DC bias power supply to the substrate support.

20. The plasma system of claim 19, wherein:

the electron source gas and the ion source gas are different gases;

the electron source gas is pure argon gas; and the plasma comprising the electrons generated by applying the source power while negatively charging the upper surfaces is an electropositive plasma.

* * * * *